United States Patent
Rotem

(10) Patent No.: US 8,861,248 B2
(45) Date of Patent: Oct. 14, 2014

(54) METHOD AND APPARATUS FOR INCREASING YIELD

(71) Applicant: Marvell Israel (M.I.S.L) Ltd., Yokneam (IL)

(72) Inventor: Eran Rotem, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 14/221,668

(22) Filed: Mar. 21, 2014

(65) Prior Publication Data

US 2014/0204695 A1     Jul. 24, 2014

Related U.S. Application Data

(63) Continuation of application No. 14/045,462, filed on Oct. 3, 2013, now Pat. No. 8,705,264, which is a continuation of application No. 12/979,724, filed on Dec. 28, 2010, now Pat. No. 8,553,442.

(60) Provisional application No. 61/312,863, filed on Mar. 11, 2010, provisional application No. 61/291,517, filed on Dec. 31, 2009.

(51) Int. Cl.
  *G11C 17/00*     (2006.01)
  *G11C 5/14*     (2006.01)

(52) U.S. Cl.
  CPC ....................... *G11C 5/147* (2013.01)
  USPC .............................. 365/94; 365/226; 365/201

(58) Field of Classification Search
  CPC ........ G11C 17/12; G11C 17/18; G11C 17/16; G11C 11/5692; H01L 27/112
  USPC ............................................ 365/94, 226, 201
  See application file for complete search history.

(56) References Cited

U.S. PATENT DOCUMENTS

| | | | |
|---|---|---|---|
| 2005/0254325 A1 | 11/2005 | Meguro et al. | |
| 2006/0184330 A1 | 8/2006 | Patel et al. | |
| 2006/0291265 A1* | 12/2006 | Schrom et al. | 365/94 |
| 2007/0271473 A1 | 11/2007 | Hosomi | |
| 2010/0329054 A1* | 12/2010 | Azimi et al. | 365/201 |

FOREIGN PATENT DOCUMENTS

| | | |
|---|---|---|
| JP | 2005-322860 | 11/2005 |
| JP | 2006-120686 | 5/2006 |
| JP | 2007-324588 | 12/2007 |

OTHER PUBLICATIONS

U.S. Appl. No. 12/730,829, filed Mar. 24, 2010 in the name of Meir Hasko.
International Search Report and Written Opinion of the International Search Authority, issued May 30, 2011 in counterpart International Application No. PCT/IB2010/003474.

* cited by examiner

*Primary Examiner* — Jason Lappas

(57) ABSTRACT

Aspects of the disclosure provide an integrated circuit (IC) that is configured to have an increased yield. The IC includes a memory element configured to store a specific value determined based on a characteristic of the IC, and a controller configured to control an input regulator based on the specific value of the IC. The input regulator is operative to provide a regulated input to the IC during operation, such that the IC performance satisfies performance requirement.

20 Claims, 10 Drawing Sheets

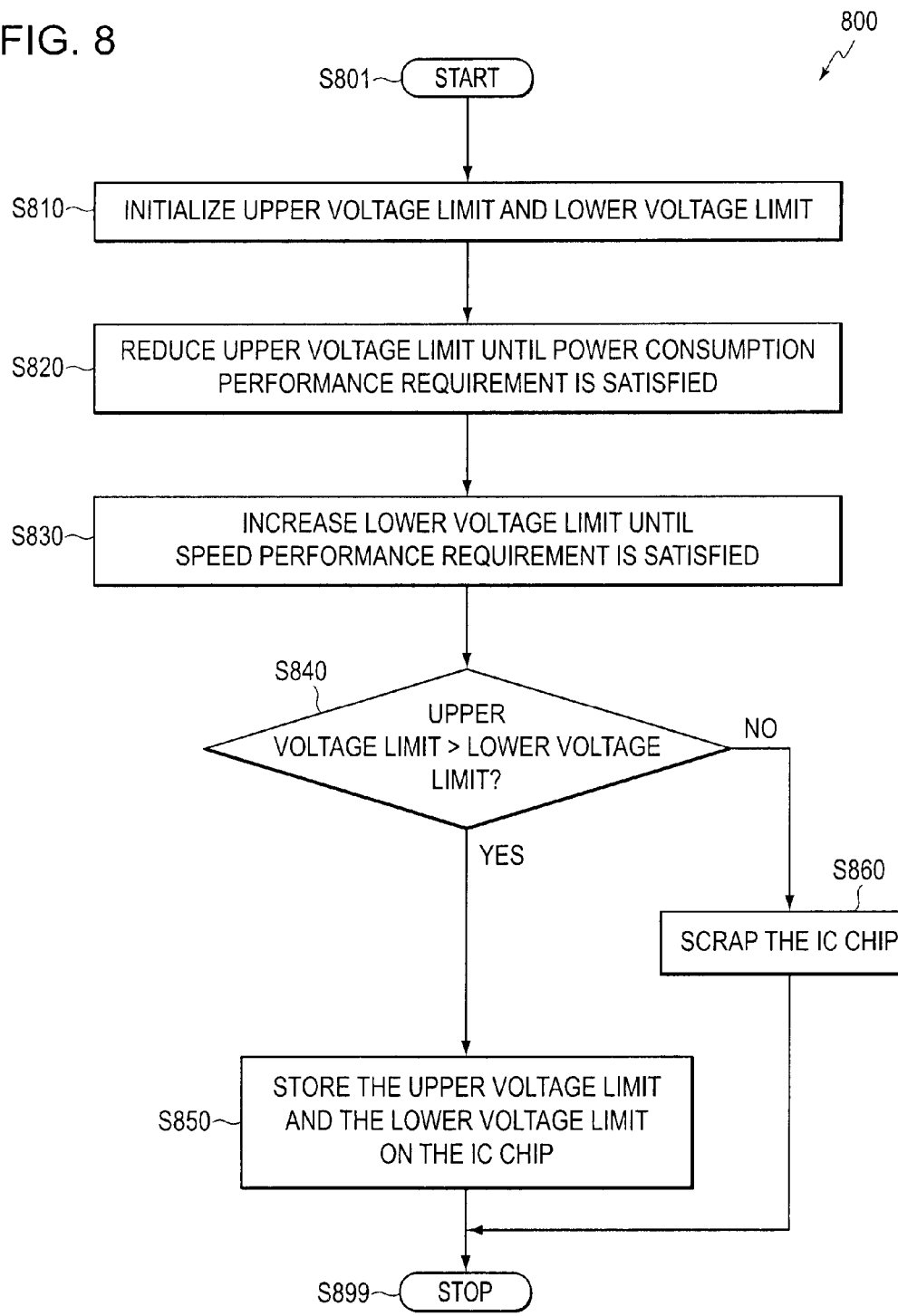

METHOD AND APPARATUS FOR INCREASING YIELD

INCORPORATION BY REFERENCE

This application is a continuation of U.S. application Ser. No. 14/045,462, filed on Oct. 3, 2013, which is a continuation of U.S. application Ser. No. 12/979,724, filed on Dec. 28, 2010, which claims priority under 35 U.S.C. §119(e) to U.S. Provisional Application No. 61/291,517, filed on Dec. 31, 2009, and U.S. Provisional Application No. 61/312,863, filed on Mar. 11, 2010. The disclosures of the applications referenced above are incorporated herein by reference in their entireties.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor devices production yield is affected by various factors, such as material contaminations, environmental and process-induced particles, process variations, and the like. In an example, process variations cause integrated circuit (IC) chips to have different performance during operation. For example, an IC chip at an edge location of a wafer may be slower than an IC chip at a center location of the same wafer due to non-uniform processing. When the edge IC chip is too slow, the edge IC chip is considered as a defective chip, and is scrapped. In a similar manner, IC chips that are too fast are sometime considered defective and are scrapped.

SUMMARY

Aspects of the disclosure provide an integrated circuit (IC). The IC includes a memory element configured to store a specific value determined based on a characteristic of the IC, and a controller configured to control an input regulator based on the specific value of the IC. The input regulator is operative to provide a regulated input to the IC.

In an embodiment, the controller is configured to generate a voltage control signal based on the stored value, and to provide the voltage control signal to a voltage regulator. The voltage regulator is configured to regulate a supply voltage to the IC based on the voltage control signal.

Further, in an example, the memory element is configured to store a first value determined based on a speed characteristic, and a second value determined based on a power consumption characteristic of the IC. For example, the memory element is configured to store a lower voltage limit determined based on the speed characteristic, and an upper voltage limit determined based on the power consumption characteristic. In an embodiment, the controller includes a monitor circuit configured to monitor a voltage on the IC during operation, and the controller is configured to generate the control signal based on the lower voltage limit, the upper voltage limit and the monitored voltage.

In another example, the memory element is configured to store a target voltage determined based on a speed characteristic and a power consumption characteristic of the IC. Then, in an embodiment, the controller includes a monitor circuit configured to monitor a voltage on the IC during operation, and the controller is configured to generate the control signal based on the target voltage and the monitored voltage.

According to an aspect of the disclosure, the controller includes a speed monitor configured to monitor a speed performance of the IC during operation, and the controller is configured to control the input regulator based on the stored value and the monitored speed performance.

Aspects of the disclosure provide a method for operating an integrated circuit (IC). The method can be used to improve yield. The method includes determining a specific value based on a characteristic of the IC, and storing the specific value in a memory element on the IC. The specific value is used to control an operation of the IC.

In an example, the method includes generating a control signal based on the stored specific value, and providing the control signal to an input regulator to cause the input regulator to regulate an input to the IC based on the characteristic of the IC.

To provide the control signal to the input regulator, the method includes providing the control signal to a voltage regulator to cause the voltage regulator to regulate a supply voltage to the IC based on the characteristic of the IC.

To determine the value based on the characteristic of the IC, in an embodiment, the method includes determining a first value based on a speed characteristic and determining a second value based on a power consumption characteristic. For example, the method includes determining a lower voltage limit based on the speed characteristic, and determining an upper voltage limit based on the power consumption characteristic. Further, the method includes monitoring a voltage on the IC during the operation, and generating the control signal based on the monitored voltage, the lower voltage limit and the upper voltage limit.

In another embodiment, the method includes determining a target voltage based on a speed characteristic and a power consumption characteristic of the IC, monitoring a voltage on the IC during operation, and generating the control signal based on the monitored voltage and the target voltage. Further, the method includes monitoring a speed performance of the IC, and generating the control signal based on the stored value and the monitored speed performance.

Aspects of the disclosure provide an electronic system. The electronic system includes an input regulator configured to provide an input based on a control signal, and an integrated circuit (IC) configured to receive the input during operation. The IC includes a memory element configured to store a specific value determined based on a characteristic of the IC, and a controller configured to generate the control signal based on the specific value.

BRIEF DESCRIPTION OF THE DRAWINGS

Various embodiments of this disclosure that are proposed as examples will be described in detail with reference to the following figures, wherein like numerals reference like elements, and wherein:

FIG. 8 shows a flow chart outlining a process example 800 for increasing yield according to an embodiment of the disclosure.

DETAILED DESCRIPTION OF EMBODIMENTS

Figure 1:
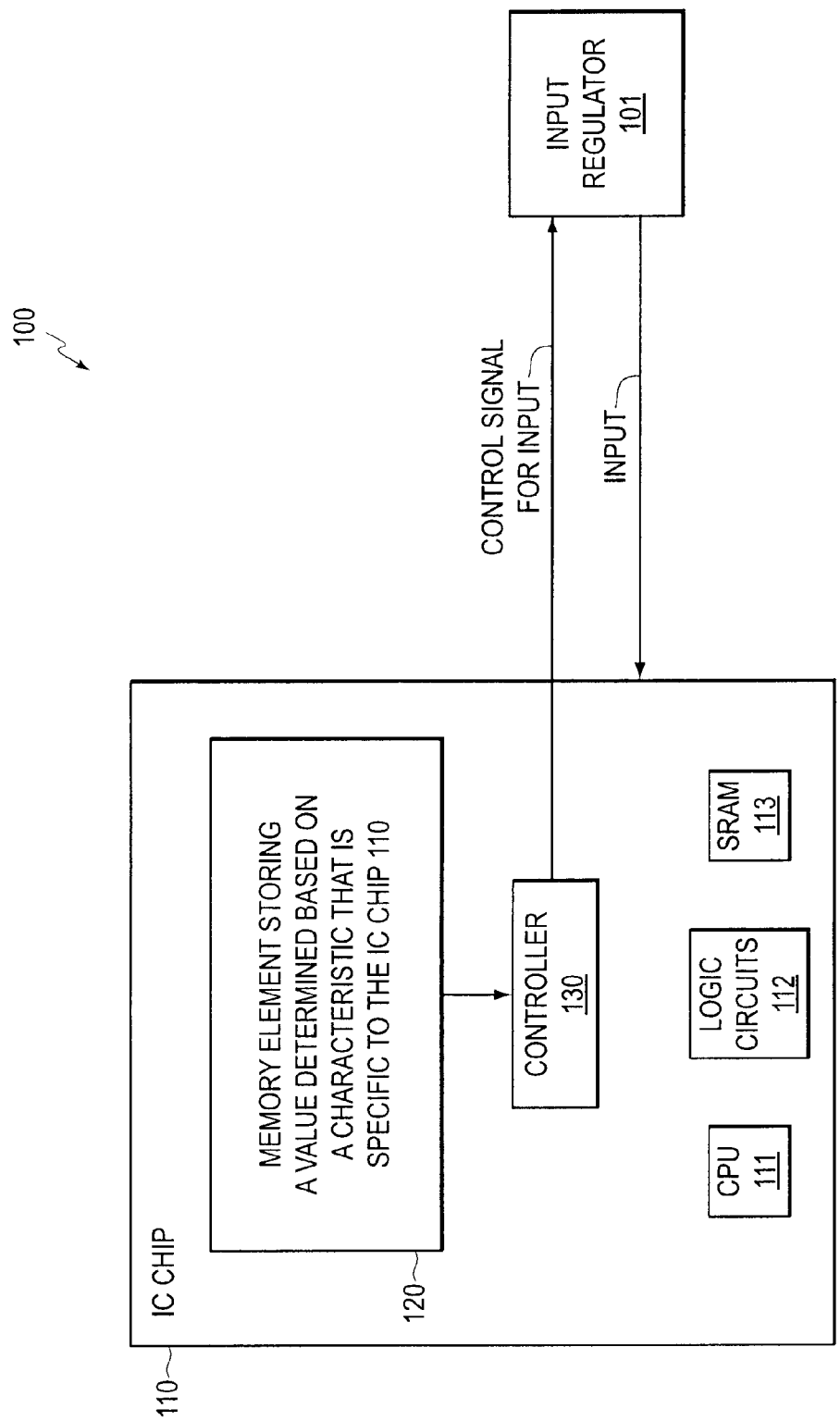
FIG. 1 shows a block diagram of an electronic system example 100 according to an embodiment of the disclosure.

FIG. 1 shows a block diagram of an electronic system example 100 according to an embodiment of the disclosure. The electronic system 100 includes an integrated circuit (IC) chip 110 coupled with an input regulator 101. The IC chip 110 includes a memory element 120 storing a value determined based on a characteristic, such as a speed characteristic, a power consumption characteristic, a voltage characteristic, and the like, that is specific to the IC chip 110. Further, the IC chip 110 includes a controller 130 that generates a control signal based on the stored value, and provides the control signal to the input regulator 101. The input regulator 101 regulates an input to the IC chip 110 based on the control signal. The input can be an electrical input, such as a supply voltage, a current, power, and the like, and an environmental input, such as a temperature, and the like. The electronic system 100 is suitably configured, such that the input provided to the IC chip 110 is a function of the characteristic of the IC chip 110. In an embodiment, according to the characteristic of the IC chip 110, the input is suitably regulated such that the performance of the IC chip 110 under the regulated input satisfies a performance requirement. Thus, the IC chip 110 is considered as a good chip.

The IC chip 110 includes any suitable functional circuits, such as central processing unit (CPU) 111, logic circuits 112, a static random access memory (SRAM) 113, and the like. It is noted that the logic circuits 112 can be digital logic circuits, analog logic circuits, or mixed logic circuits.

Generally, an IC chip has to meet various requirements to be considered as a good chip. In an embodiment, the IC chip needs to meet a functional requirement to have correct functions. In addition, the IC chip needs to meet a performance requirement, such as a speed performance requirement, a power consumption performance requirement, a combination of the speed performance requirement and the power consumption performance requirement, and the like. In an example, the IC chip is used in a battery-powered system having a required clock frequency. The IC chip needs to meet a speed performance requirement that enables correct operations using the required clock frequency. Further, the IC chip needs to meet a power consumption performance requirement to enable a relatively long battery life.

In another example, the IC chip is used in a non-battery powered system using a required clock frequency. The non-battery powered system has a limited heat sink. For example, the system is cooled by a relatively small fan that has a relatively small cooling capacity. Thus, the IC chip needs to meet a speed performance requirement that enables correct operations using the required clock frequency. Further, the IC chip needs to meet a power consumption performance requirement to ensure that the IC chip does not overheat by itself nor overheats the system.

The performance of an IC chip depends on inputs, such as electrical inputs, environmental inputs, and the like. In an example, an IC chip has a relatively slow speed and a relatively low power consumption using a relatively small supply voltage, and has a relatively fast speed and a relatively high power consumption using a relatively large supply voltage. In another example, an IC chip has a relatively fast speed and a relatively low standby power consumption under a relatively low temperature, and has a relatively slow speed and a relatively high standby power consumption under a relatively high temperature.

According to an embodiment of the disclosure, the value stored in the memory element 120 is determined based on the characteristic that is specific to the IC chip 110. In an example, the value stored in the memory element 120 is indicative of a speed characteristic for the IC chip 110, such as a fast chip, a slow chip, and the like. Further, during the operation of the electronic system 100, the stored value is suitably used to control the provided input by the input regulator 101 as a function of the characteristic, such that the performance of the IC chip 110 satisfies the performance requirement.

In an example, the IC chip 110 is considered as a defective chip under a general input range, because the IC chip 110 does not always satisfy the performance requirement for all input values within the general input range. According to an embodiment of the disclosure, by regulating an input, such as a supply voltage to the IC chip 110 as a function of the characteristic that is specific to the IC chip 110, performance of the IC chip 110 can be tweaked so that the IC chip 110 meets the performance requirement. IC chips typically are designed to satisfactorily operate using the general input range. Some IC chips that meet the performance requirement in a subset of the input range would normally be scrapped. According to an aspect of the disclosure, those IC chips can be deemed "good enough", and thus saved, merely by regulating the input so that only the subset of the input range that enables a particular IC chip 110 to meet its performance requirements is supplied to this particular IC chip 110.

In an example, IC chips are tested according to a generally provided supply voltage in the range of [0.9V, 1.1V]. The IC chip 110 does not always satisfy a performance requirement, such as a speed performance requirement, under the generally provided supply voltage in the full range of [0.9V, 1.1V]. In an example, the IC chip 110 satisfies the speed performance requirement when the provided supply voltage is in the range of [0.95V, 1.1V] and does not satisfy the speed performance requirement when the provided supply voltage is in the range of [0.9V, 0.95V]. Thus, the IC chip 110 is considered as a defective chip under the generally provided supply voltage, and is counted in yield loss.

According to an embodiment of the disclosure, the memory element 120 stores a value determined based on the characteristic, such as the inherent speed characteristic, that is specific to the IC chip 110. For example, the stored value is indicative of a slow chip that only satisfies a specified performance requirement when the supply voltage is in the range of [0.95V, 1.1V]. Then, when the IC chip 110 is used in the electronic system 100, the stored value is suitably used for regulating the supply voltage to be only within the range of [0.95V, 1.1V], such that the IC chip 110 always satisfies the performance requirement. Thus, the IC chip 110 can be considered as a good chip instead of a defective chip, and the product yield increases.

Figure 2:
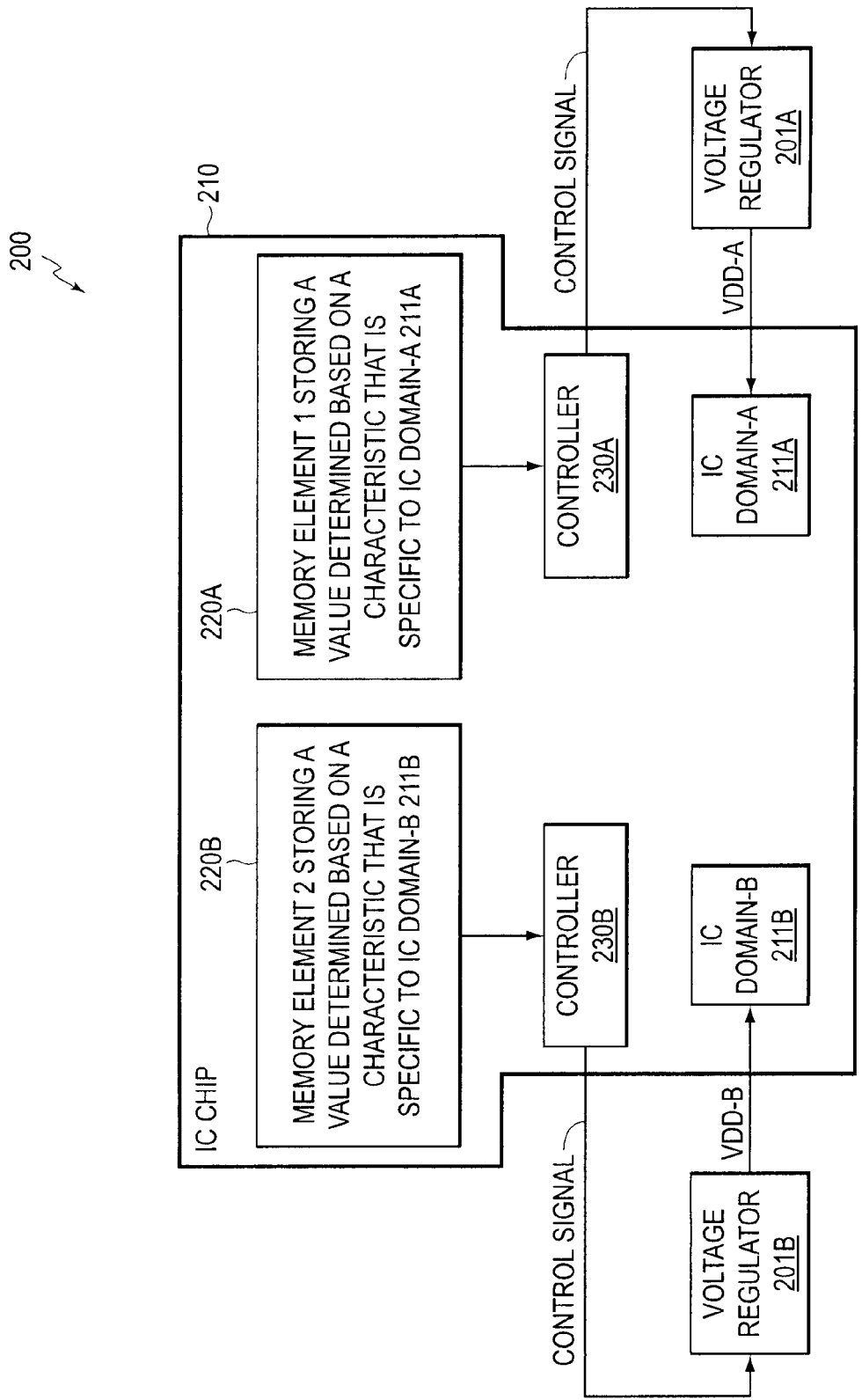
FIG. 2 shows a block diagram of an electronic system example 200 according to an embodiment of the disclosure.

FIG. 2 shows a block diagram of an electronic system example 200 according to an embodiment of the disclosure. The electronic system 200 includes an integrated circuit (IC) chip 210 coupled with a voltage regulator 201A. The IC chip 210 includes an IC domain-A 211A, a memory element 220A storing a value determined based on a characteristic that is specific to the IC domain-A 211A. Further, the IC chip 210 includes a controller 230A that generates a control signal based on the stored value, and provides the control signal to the voltage regulator 201A to control regulation of voltage input to IC chip 210. The voltage regulator 201A generates the supply voltage VDD-A based on the control signal and provides the supply voltage VDD-A to the IC domain-A 211A. The electronic system 200 is suitably configured such that the supply voltage VDD-A is a function of the characteristic that is specific to the IC domain-A 211A.

In an embodiment, the IC domain-A 211A needs to have correct functions and meet performance requirement, such as a speed performance requirement and/or a power consumption performance requirement, to be considered as good circuit. The speed and the power consumption depend on the supply voltage VDD-A. In an example, when the supply voltage VDD-A is relatively low, the IC domain-A 211A has a relatively slow speed performance and a relatively low power consumption performance; and when the supply voltage VDD-A is relatively high, the IC domain-A 211A has a relatively fast speed performance and a relatively high power consumption performance.

In an example, a generally provided supply voltage is in the range of [0.9V, 1.1V]. When the IC domain-A 211A does not always satisfy the speed performance requirement and the power consumption performance requirement under the generally provided supply voltage, the IC domain-A 211A is considered as a defective IC domain, and the IC chip 210 is considered as a defective chip. For example, the IC domain-A 211A satisfies the speed performance requirement when the provided supply voltage is in the range of [0.95V, 1.1V] and does not satisfy the speed performance requirement when the provided supply voltage is in the range of [0.9V, 0.95V]. Then, in this example the IC chip 210 would be considered as a defective IC under the generally provided supply voltage, and is counted in yield loss, because in the example the IC domain-A 211A fails to meet the specified speed performance requirement when the supply voltage is within the range of [0.9V, 0.95V]. Further, in another example, the IC domain-A 211A satisfies the power consumption performance requirement when the provided supply voltage is in the range of [0.9V, 1.05V], and does not satisfy the power consumption performance requirement when the provided supply voltage is in the range of [1.05V, 1.1V]. Then, in this example, the IC chip 210 would be considered as a defective IC under the generally specified supply voltage, and is counted in yield loss, because in the example the IC domain-A 211A fails to meet specified power consumption performance requirement when the supply voltage is within the range of [1.05V, 1.1V].

According to an embodiment of the disclosure, the memory element 220A stores a first value determined based on a speed characteristic and a second value determined based on a power consumption characteristic. In an example, the first value indicates that the IC domain-A 211A is a slow IC domain that satisfies the speed performance requirement when the provided supply voltage is in the range of [0.95V, 1.1V], and the second value indicates that the IC domain-A 211A satisfies the power consumption performance requirement in the entire supply voltage range. Then, during operation, the controller 230A generates the control signal based on the first value and the second value. The control signal is provided to the voltage regulator 201A. The voltage regulator 201A provides the supply voltage VDD-A based on the control signal, such that the provided supply voltage VDD-A is in the range of [0.95V, 1.1V]. Thus, the IC domain-A 211A satisfies the speed performance requirement and the power consumption performance requirement. As a result, the IC domain-A 211A is considered as a good IC domain instead of a defective IC domain.

In another example, the first value indicates that the IC domain-A 211A satisfies the speed performance requirement in the entire voltage range, and the second value indicates that the IC domain-A 211A is a leaky IC domain that satisfies the power consumption performance requirement when the provided supply voltage is in the range of [0.9V, 1.05V], for example. Then, during operation, the controller 230A generates the control signal based on the first value and the second value. The control signal is provided to the voltage regulator 201A. The voltage regulator 201A provides the supply voltage VDD-A based on the control signal, such that the provided supply voltage VDD-A is in the range of [0.9V, 1.05V]. Thus, the IC domain-A 211A satisfies the speed performance requirement and the power consumption performance requirement during operation. As a result, the IC domain-A 211A is considered as a good IC domain instead of a defective IC domain.

In an embodiment, the voltage regulator 201A is a digital voltage regulator. The controller 230A generates a digital control signal based on the stored value, and provides the digital control signal to the voltage regulator 201A.

In another embodiment, the voltage regulator 201A is an analog voltage regulator. The controller 230A generates an analog control signal based on the stored value, and provides the analog control signal to the voltage regulator 201A. A suitable controller generating an analog control signal for controlling a voltage regulator is disclosed in Assignee's co-pending application Ser. No. 12/730,829, filed Mar. 24, 2010, which is incorporated herein by reference in its entirety.

It is noted that, in an embodiment, the IC chip 210 includes multiple integrated circuit domains that are coupled to respective voltage regulators. In the FIG. 2 example, the IC chip 210 also includes an IC domain-B 211B coupled to a voltage regulator 201B. The voltage regulator 201B controls the supply voltage VDD-B to the IC domain-B 211B. In an embodiment, the IC chip 210 includes a first power grid (not shown) for providing the supply voltage to circuits in the IC domain-A 211A and a second power grid (not shown) for providing supply voltage to circuits in the IC domain-B 211B.

Further, the IC chip 210 includes a memory element 220B storing a value determined based on a characteristic that is specific to the IC domain-B 211B. Also, the IC chip 210 includes a controller 230B that generates a control signal based on the stored value in the electronic element 220B, and provides the control signal to the voltage regulator 201B. Based on the control signal, the voltage regulator 201B controls the supply voltage VDD-B to the IC domain-B 211B.

It is noted that, in an example, the first set including the memory element 220A, the controller 230A and the voltage regulator 201A, and the second set including the memory element 220B, the controller 230B, and the voltage regulator 201B operate independently from each other.

Figure 3A:
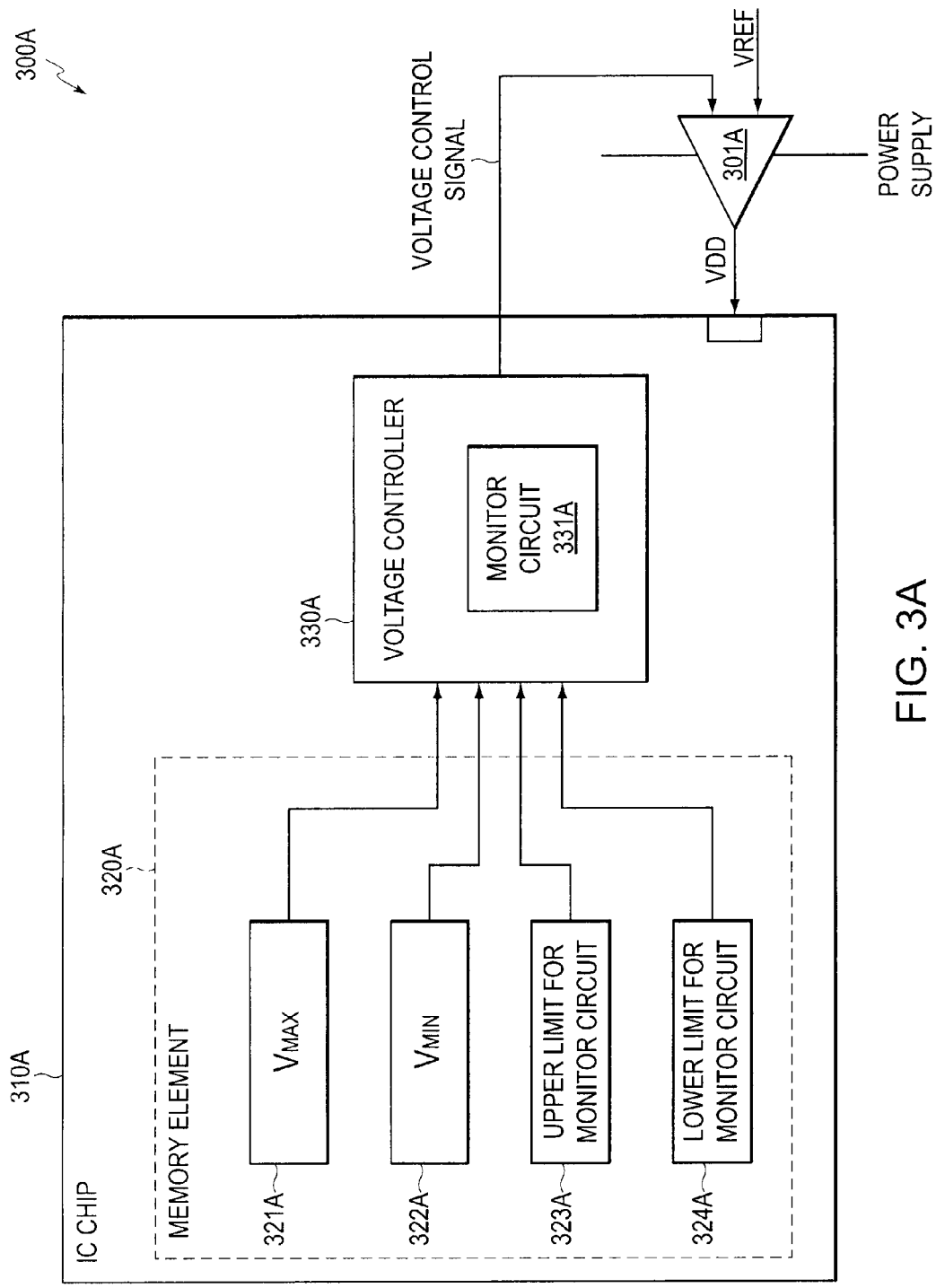
FIG. 3A shows a block diagram of an electronic system 300A according to an embodiment of the disclosure.

FIG. 3A shows a block diagram of an electronic system 300A according to an embodiment of the disclosure. The electronic system 300A includes an integrated circuit (IC) chip 310 coupled with a voltage regulator 301A. The IC chip 310A includes a memory element 320A storing values determined based on general characteristics and characteristics that are specific to the IC chip 310A. Further, the IC chip 310A includes a voltage controller 330A that generates a voltage control signal based on the stored values, and provides the voltage control signal to the voltage regulator 301A. The voltage regulator 301A regulates the supply voltage VDD based on the voltage control signal and provides the supply voltage VDD to the IC chip 310A. The electronic system 300 is suitably configured such that the supply voltage VDD is a function of the characteristics that are specific to the IC chip 310A according to the values that are determined based on these characteristics and that are stored in memory element 320A.

In the FIG. 3A example, the voltage controller 330A includes a monitor circuit 331A monitoring a parameter during operation. In an example, the monitor circuit 331A is configured to monitor a voltage on the IC chip 310A during operation. In another example, the monitor circuit 331A is configured to monitor a frequency of an oscillator on the IC chip 310A during operation. The monitored parameter is used to dynamically regulate the supply voltage VDD to the IC chip 310A. In an embodiment, the voltage controller 330A and the voltage regulator 301A are suitably coupled to form a feedback loop. Specifically, the monitored parameter is a function of the provided supply voltage. The voltage controller 330A generates the voltage control signal based on the monitored parameter. Then, the voltage control signal is used by the voltage regulator 301A to regulate the provided supply voltage.

In the FIG. 3A example, the memory element 320A stores a first value 321A that corresponds to a maximum permissible voltage value of a generally provided supply voltage, a second value 322A that corresponds to a minimum permissible voltage value of the generally provided supply voltage, a third value 323A that is an upper limit for the parameter monitored by the monitor circuit 331A, and a fourth value 324A that is a lower limit for the parameter monitored by the monitor circuit 331A.

In an example, the first value 321A and the second value 322A are hard limits that are specified for ICs of a same product. Thus, in an example, the first value 321A and the second value 322A are hard coded in the design. The third value 323A and the fourth value 324A are specific to the IC chip 310A, and are determined based on characteristics of the IC chip 310A. In an example, the third value 323A and the fourth value 324A are determined based on suitable testing of the IC chip 310A, and then are stored in One-Time Programmable (OTP) memories after the testing. It is noted that the OTP memories can be implemented by any suitable techniques, such as fuse links, floating gate non-volatile memory, and the like.

Further, the voltage controller 330A generates a voltage control signal based on the stored values and the monitored parameter. In an embodiment, the monitoring circuit 331A monitors a voltage on the IC chip 310A. The third value 323A is an upper voltage limit of the monitored voltage, and is determined based on a power consumption characteristic of the IC chip 310A. For example, when the third value 323A is smaller than the first value 321A, the IC chip 310A is a leaky chip. Thus, when the monitored voltage is larger than the third value 323A, the power consumption of the circuits in the IC chip 310A does not satisfy the power consumption performance requirement. The fourth value 324A is a lower voltage limit of the monitored voltage, and is determined based on a speed characteristic of the IC chip 310A. For example, when the fourth value 324A is larger than the second value 322A, the IC chip 310A is a slow chip. Thus, when the monitored voltage is lower than the fourth value 324A, the speed of the circuits in the IC chip 310A does not satisfy the speed performance requirement. Then, in an embodiment, the voltage controller 330A suitably generates the control signal based on the stored values 321A-324A to keep the supply voltage within the range defined by 321A and 322A, and to keep the monitored voltage within the range defined by 323A and 324A.

In another embodiment, the monitor circuit 331A monitors a speed of speed monitoring circuit. In an example, the monitor circuit 331A includes an oscillator that generates a digital value that is indicative of a speed of circuits on the IC chip 310A during operation. The third value 323A is an upper limit of the digital value, and is determined based on a power consumption characteristic of the IC chip 310A. For example, when the monitored speed is larger than the third value 323A, the power consumption of the circuits in the IC chip 310A does not satisfy the power consumption performance requirement. The fourth value 324A is a lower limit of the digital value, and is determined based on a speed characteristic of the IC chip 310A. For example, when the monitored speed is lower than the fourth value 324A, the speed of the circuits in the IC chip 310A does not satisfy the speed performance requirement. Then, in an embodiment, the voltage controller 330A suitably generates the control signal based on the stored values 321A-324A to keep the digital value from the monitor circuit 331A within the range defined by 323A and 324A, and to keep the supply voltage within the range defined by 321A and 322A.

Figure 3B:
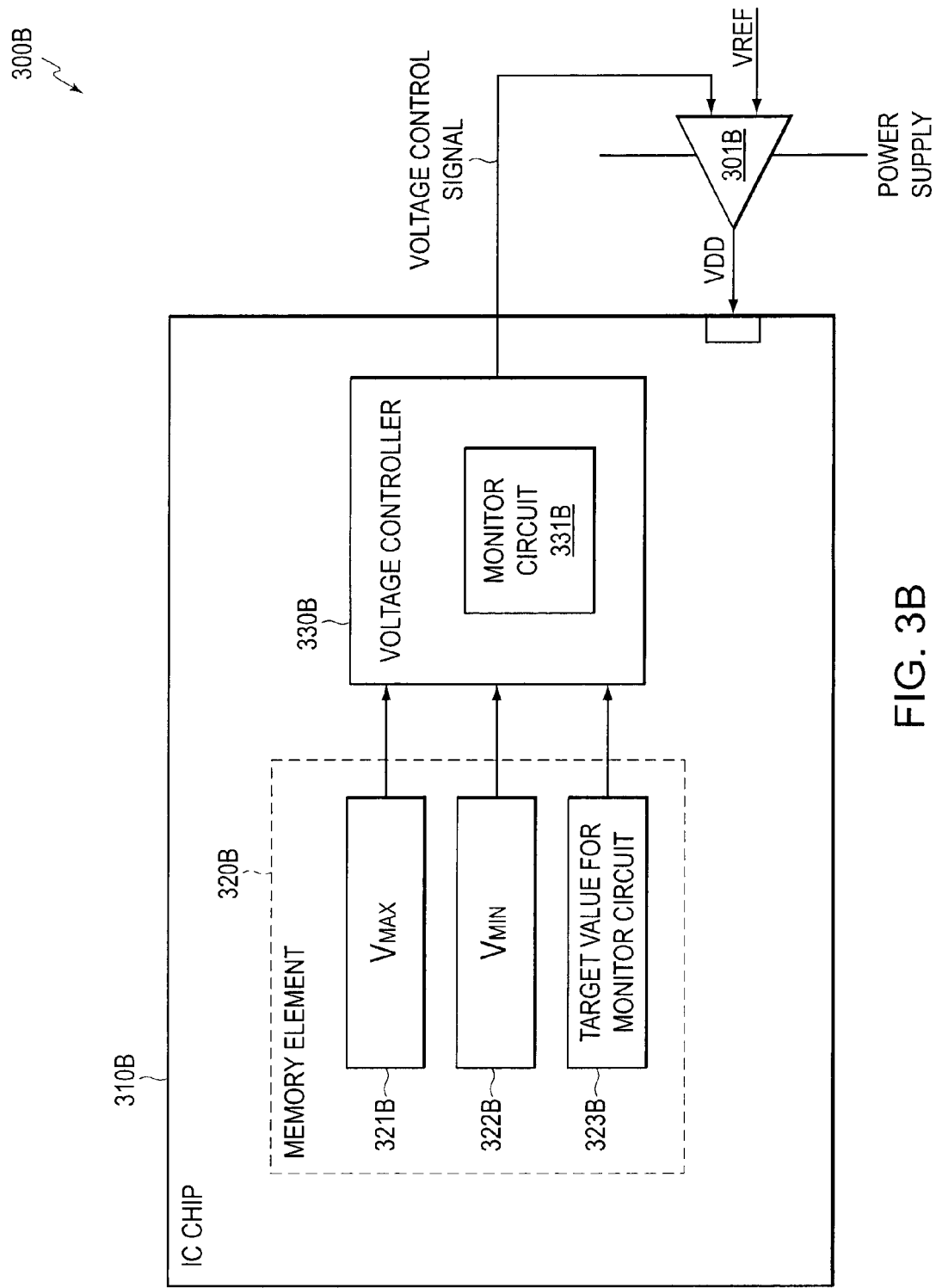
FIG. 3B shows a block diagram of an electronic system 300B according to an embodiment of the disclosure.

FIG. 3B shows a block diagram of an electronic system 300B according to an embodiment of the disclosure. The electronic system 300B utilizes certain components that are identical or equivalent to those used in the electronic system 300A; the description of these components has been provided above and will be omitted here for clarity purposes. However, in this embodiment, the memory element 320B stores a third value 323B that is a target value for the parameter monitored by the monitor circuit 331B. In an example, the third value 323B is determined based on the speed characteristic and the power consumption characteristic, and then is stored in OTP memory on the IC chip 310B.

Further, the voltage controller 330B generates a voltage control signal based on the stored values and the monitored parameter. In an embodiment, the monitor circuit 331B includes an oscillator that generates a digital value that is indicative of a speed performance of circuits on the IC chip 310B during operation. The third value 323B is a target value of the digital value, at which, the speed performance and the power consumption performance of the IC chip 310B respectively satisfy the speed performance requirement and the power consumption performance requirement. Then, in an embodiment, the voltage controller 330B suitably generates the voltage control signal based on the stored values 321B-323B to keep the monitored speed at the target value 323B, and to keep the supply voltage within the range defined by the stored values 321B-322B.

It is noted that the functions of the voltage controller can be implemented by dedicated controller, or can be added into an existing voltage controller, such as an Adaptive Voltage Scaling (AVS) module that already exists in some products.

Figure 4A:
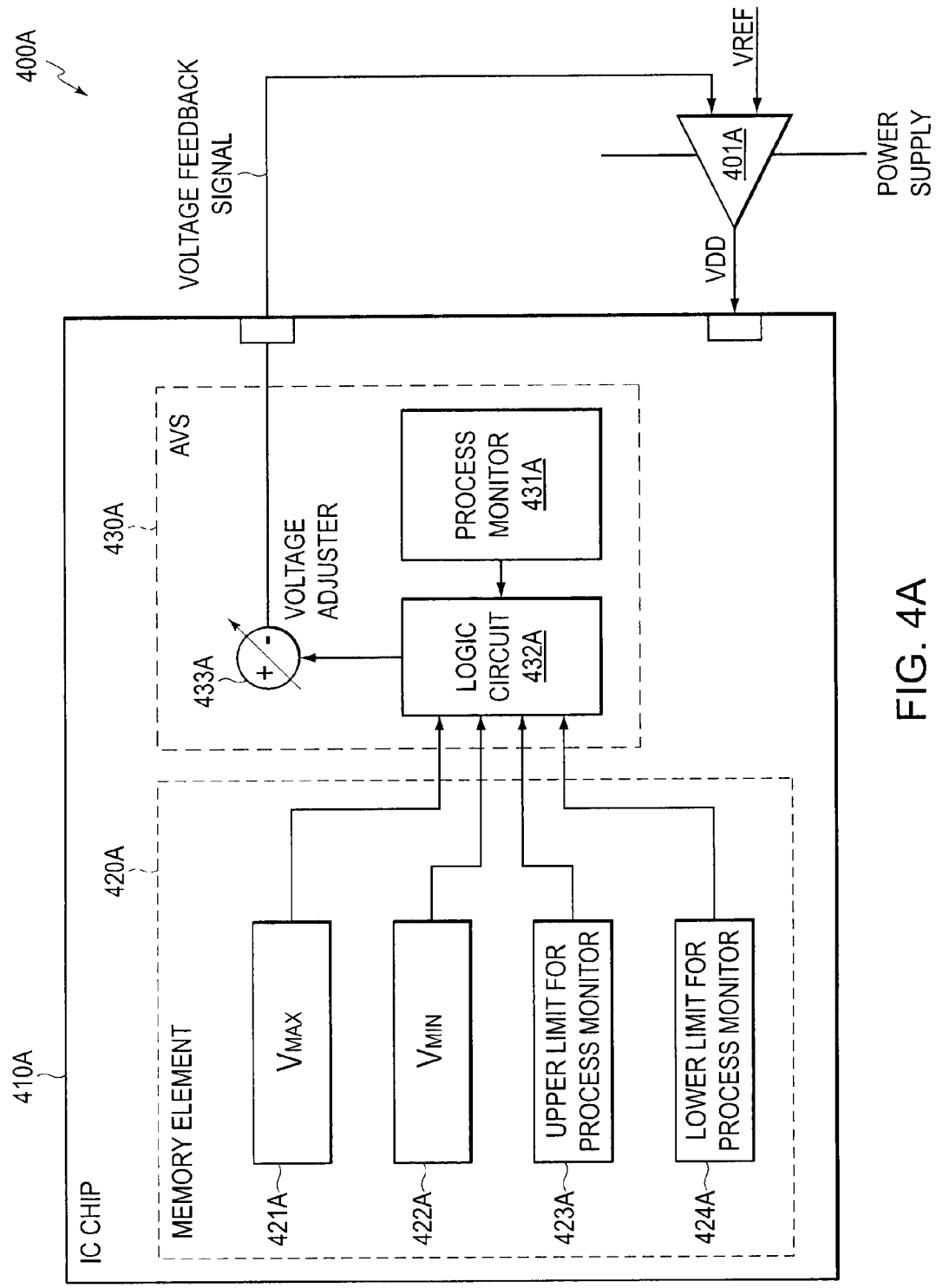
FIG. 4A shows a block diagram of an electronic system 400A according to an embodiment of the disclosure.

FIG. 4A shows a block diagram of an electronic system 400A according to an embodiment of the disclosure. The electronic system 400A also utilizes certain components that are identical or equivalent to those used in the electronic system 300A; the description of these components has been provided above and will be omitted here for clarity purposes. However, in this embodiment, the voltage controller is implemented using an existing circuit module—an AVS module 430A. The AVS module 430A includes a process monitor 431A, a logic circuit 432A and a voltage adjustor 433A. These elements are coupled together as shown in FIG. 4A.

The process monitor 431A monitors a parameter during operation. The parameter is affected by process variations, and also depends on the supply voltage VDD provided by the voltage regulator. The memory element 420A stores a third value 423A that is an upper limit for the parameter monitored by the process monitor 431A, and a fourth value 424A that is a lower limit for the parameter.

The monitored parameter is provided to the logic circuit 432A. The logic circuit 432A is suitably implemented to generate an adjustment signal based on the monitored parameter and values stored in the memory element 420A, and provide the adjustment signal to the voltage adjustor 433A. The voltage adjustor 433A adjusts a voltage feedback signal based on the adjustment signal, and outputs the voltage feedback signal to the voltage regulator 401A. Then, the voltage regulator 401A regulates the supply voltage VDD to the IC chip 410A.

Figure 4B:
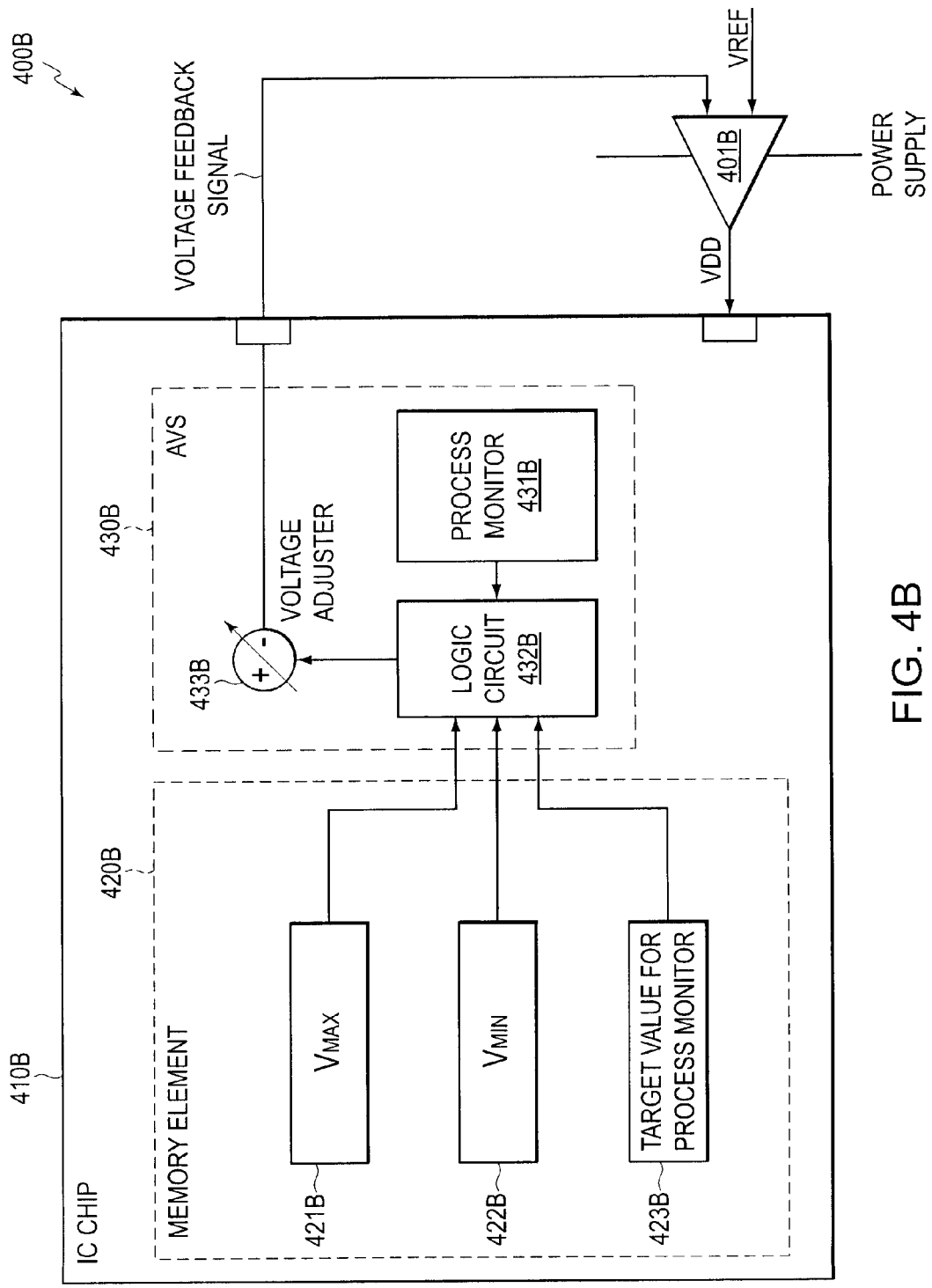
FIG. 4B shows a block diagram of an electronic system 400B according to an embodiment of the disclosure.

FIG. 4B shows a block diagram of an electronic system 400B according to an embodiment of the disclosure. The electronic system 400B utilizes certain components that are identical or equivalent to those used in the electronic system 400A; the description of these components has been provided above and will be omitted here for clarity purposes. However, in this embodiment, the memory element 420B stores a third value 423B that is a target value for the parameter monitored by the process monitor 431B. In an example, the third value 423B is determined based on the speed characteristic and the power consumption characteristic of the IC chip 410B, and then is stored in OTP memory on the IC chip 410B.

Further, the voltage controller 430B generates a voltage control signal based on the stored values and the monitored parameter. In an embodiment, the process monitor 431B includes an oscillator that generates a digital value that is indicative of a speed of circuits on the IC chip 410B during operation. The third value 423B is a target value of the digital value, at which, the speed performance and the power consumption performance of the IC chip 410B respectively satisfy the speed performance requirement and the power consumption performance requirement. Then, in an embodiment, the logic circuits 432B suitably generates the adjustment signal based on the stored values 421B-423B to keep the monitored speed at the target value defined by the stored value 423B, and to keep the supply voltage within the range defined by the stored values 421B-422B.

Figure 5:
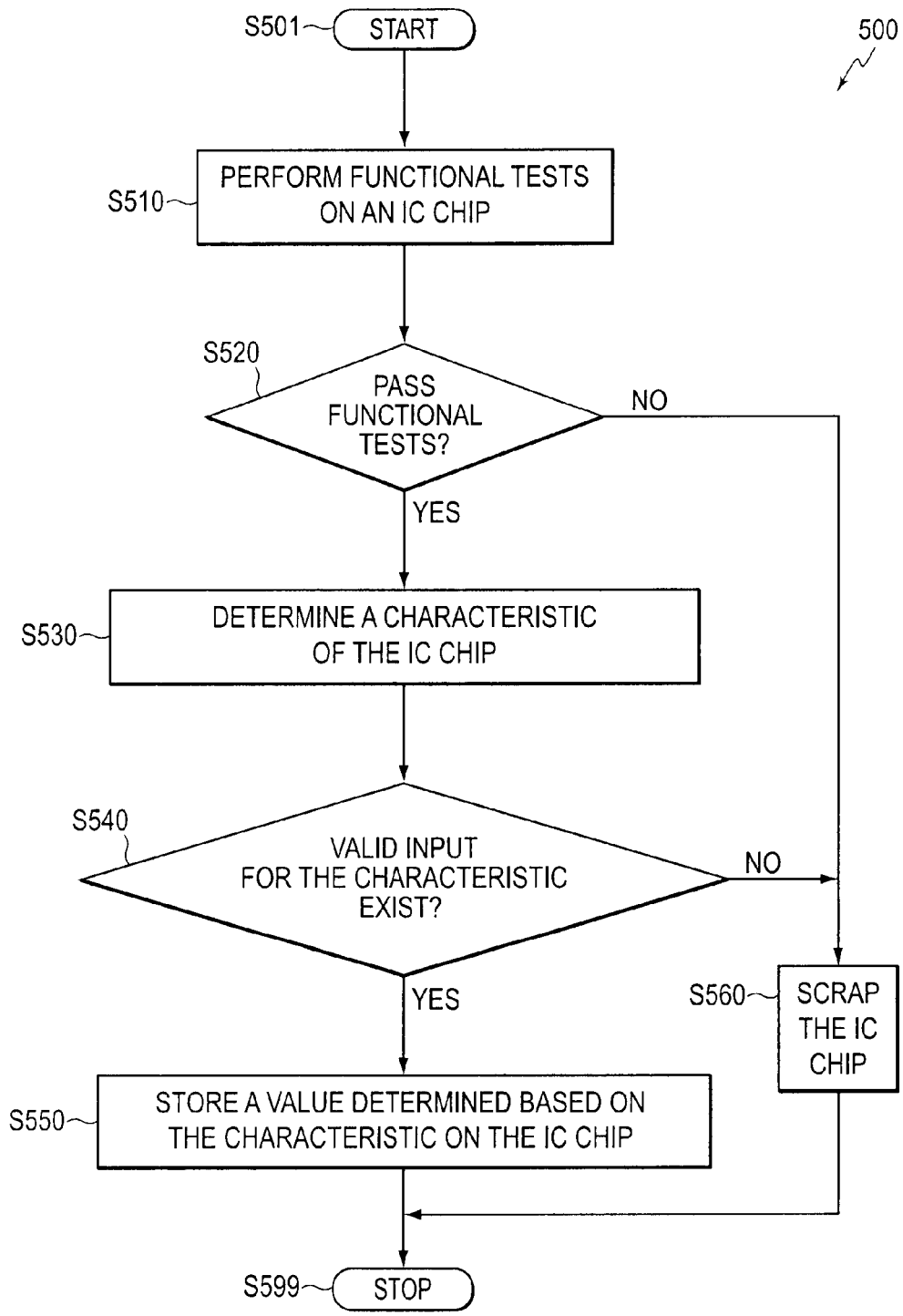
FIG. 5 shows a flow chart outlining a process example 500 for testing an IC chip according to an embodiment of the disclosure.

FIG. 5 shows a flow chart outlining a process example for testing an IC chip according to an embodiment of the disclosure. It is noted that, in an embodiment, the IC chip is within a suitable package, and the package is suitably tested. In another embodiment, the IC chip is still on a wafer, and the IC chip is suitably tested by a wafer test. The process starts at S501 and proceeds to S510.

At S510, a first tester performs functional tests on the IC chip.

At S520, the tester determines whether the IC chip passes the functional tests. When the IC chip passes the functional test, the process proceeds to S530; otherwise, the process proceeds to S560.

At S530, a second tester performs tests to determine a characteristic of the IC chip. It is noted that the second tester can be the same tester as the first tester or can be a different tester from the first tester. In an embodiment, the IC chip includes process monitor that is tested to determine the characteristic. In another embodiment, a suitable process monitor is in a scribe line that is next to the IC chip. The process monitor is tested to determine the characteristic of the IC chip. In an example, a process monitor includes a ring oscillator. The ring oscillator is suitably tested to determine a speed characteristic of the IC chip. In another example, a process monitor includes device structures, such as transistors, and the like, that can be suitably tested to determine various device parameters, such as threshold, sub-threshold current, and the like. Based on the device parameters, the characteristic, such as speed characteristic, power consumption characteristic, and the like, is suitably determined.

At S540, the second tester, or any other suitable controller, determines whether valid inputs exist for the characteristic. In an example, the second tester determines whether supply voltages that make the IC chip having the characteristic meet the speed performance requirement and power consumption performance requirement are in the range defined by the hard coded minimum and maximum voltage values. When valid inputs exist, the process proceeds to S550; otherwise, the process proceeds to S560.

At S550, one or more values determined based on the characteristic of the IC chip are stored in a memory element on the IC chip. In an embodiment, the memory element includes a One Time Programmable (OTP) memory that is programmed to store the values. It is noted that the values can be suitably determined to correspond to any suitable parameters to simplify further operation. In an example, the IC chip includes an on-chip speed monitor to monitor a speed performance, and then a speed target value that is determined based on a speed characteristic and a power consumption characteristic of the IC chip is stored in the memory element on the IC chip. In another example, the IC chip includes an on-chip voltage monitor, and thus an upper voltage limit determined based on a power consumption characteristic of the IC chip and a lower voltage limit determined based on a speed characteristic of the IC chip are stored in the memory element on the IC chip. The process then proceeds to S599 and terminates.

At S560, the IC chip is scrapped, and the process proceeds to S599 and terminates.

It is noted that the process 500 can be suitably modified. In an example, a parametric tester tests device structures in a scribe line that is next to the IC chip before the functional test. The parametric test results, such as threshold, sub-threshold current, and the like are stored in association with the IC chip in a data base for parametric test. After the functional test, the stored parametric test results are retrieved and used to determine the characteristic of the IC chip.

Figure 6:
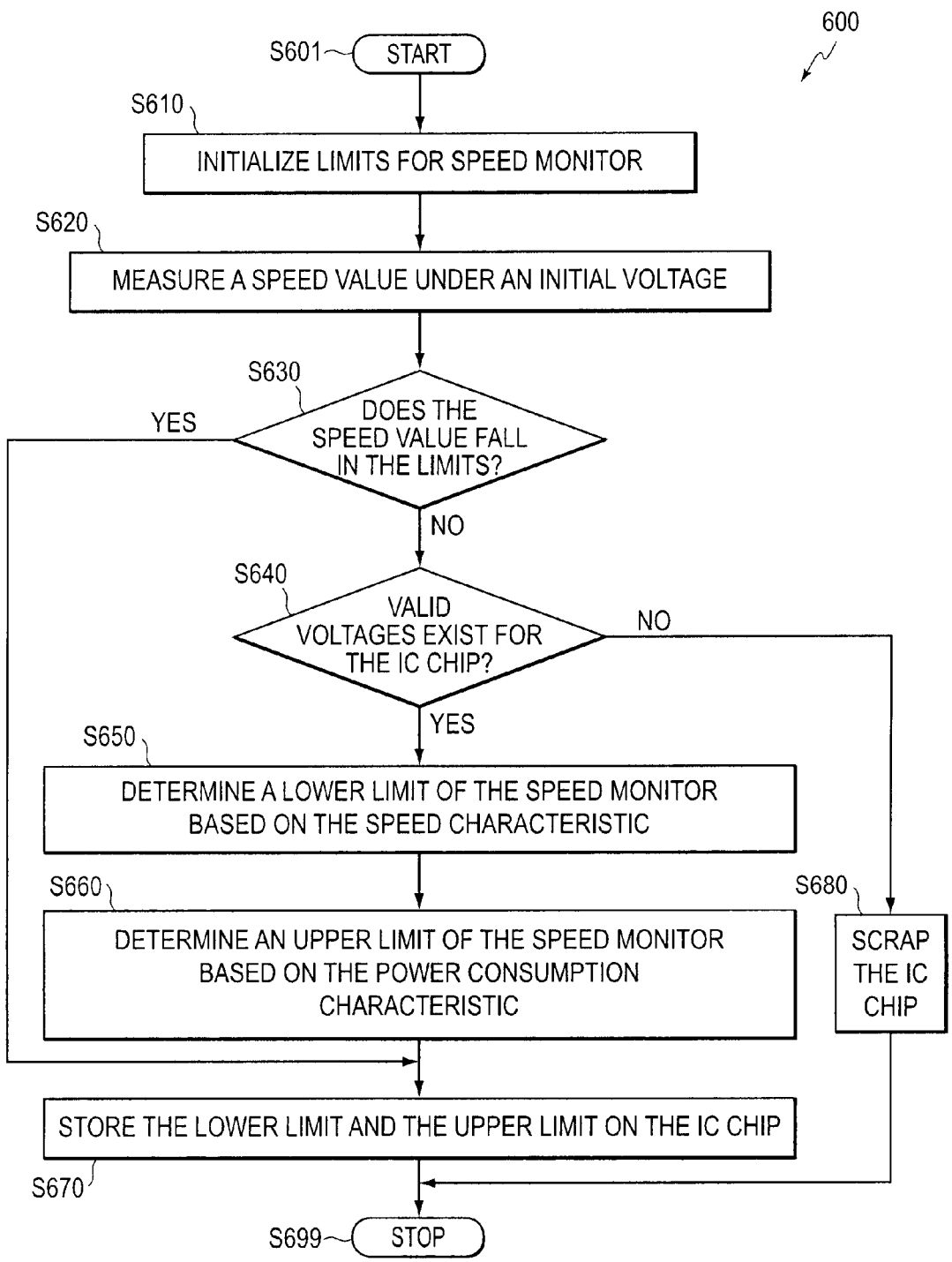
FIG. 6 shows a flow chart outlining a process example 600 for increasing yield according to an embodiment of the disclosure.

FIG. 6 shows a flow chart outlining a process example 600 for increasing yield according to an embodiment of the disclosure. The process 600 is a detailed example of S530-S560 in FIG. 5. In the example, an IC chip includes a speed monitor that monitors a speed of circuits in the IC chip during operation. It is noted that the speed is affected by process variations and also affected by inputs, such as supply voltage, temperature, and the like. The process starts at S601 and proceeds to S610.

At S610, limits for the speed monitored by the on-chip speed monitor are initialized. In an example, a lower limit of the speed performance monitored by the speed monitor is determined according to minimum speed performance requirement and statistical data of previous measurement; and an upper limit of the speed is determined according to maximum power consumption performance requirement and the statistical data of previous measurement.

At S620, the tester applies an initial voltage on the IC chip, and measures a speed value of the speed monitor. It is noted that during this test, the voltage provided to the IC chip is not regulated based on the voltage control signal from the IC chip, but is controlled by the tester. In an example, the initial voltage is a medium voltage in a general voltage range, such as 1V of a general voltage range of [0.9V, 1.1V].

At S630, the tester determines whether the measured speed value falls in the range defined by the limits. When the measured speed value is within the range, the process proceeds to S670; otherwise, the process proceeds to S640.

At S640, the tester tests the IC chip to determine whether valid voltages that make the IC chip to satisfy the speed performance requirement and the power consumption performance requirement exist. In an example, the tester searches up from the medium voltage or searches down from the medium voltage to find a voltage under which the measured speed value falls in the range defined by the limits, and checks whether the voltage is within the permissible voltage range. In an embodiment, the voltage is indicative of characteristics of the IC chip. For example, when the voltage is larger than the medium voltage, the IC chip is a slow chip, and when the voltage is smaller than the medium voltage, the IC is a leaky chip. When the voltage is in the permissible range, the process proceeds to S650; otherwise, the process proceeds to S680.

At S650, the tester determines a lower limit of the on-chip speed monitor based on the speed characteristic. It is noted that, in an example, the tester determines the lower limit based on the found voltage in S640. In another example, the tester determines the lower limit based on additional test results, such as test results of device structures in the scribe line or in a test die.

At S660, the tester determines an upper limit of the on-chip speed monitor corresponding to the power consumption characteristic. It is noted that, in an example, the tester determines the upper limit based on the found voltage in S640. In another example, the tester determines the upper limit based on additional test results, such as test results of device structures in the scribe line or in a test die.

At S670, the lower limit and the upper limit are stored on the IC chip. In an embodiment, the lower limit and the upper limit are stored in OTP memory on the IC chip. The process then proceeds to S699, and terminates.

At S680, the IC chip is scrapped and the process proceeds to S699 and terminates.

In a comparison test example, in S630, when the measured speed value does not fall in the range defined by the limits, the IC chip is scrapped due to the reason the IC chip does not always satisfy the speed performance requirement and the power consumption performance requirement using the generally provided supply voltage. However, in FIG. 6 example, the IC chip is further tested to determine whether the supply voltage can be controlled based on the characteristic of the IC chip to make the IC satisfy the speed performance requirement and the power consumption performance requirement. When such supply voltage exists, the IC chip is considered as a good chip, and can be used in an electronic system, such as the electronic system 200. By this method, a portion of IC chips that are considered as defective chips in the comparison test example, are now considered as good chip, and then product yield is increased.

Figure 7:
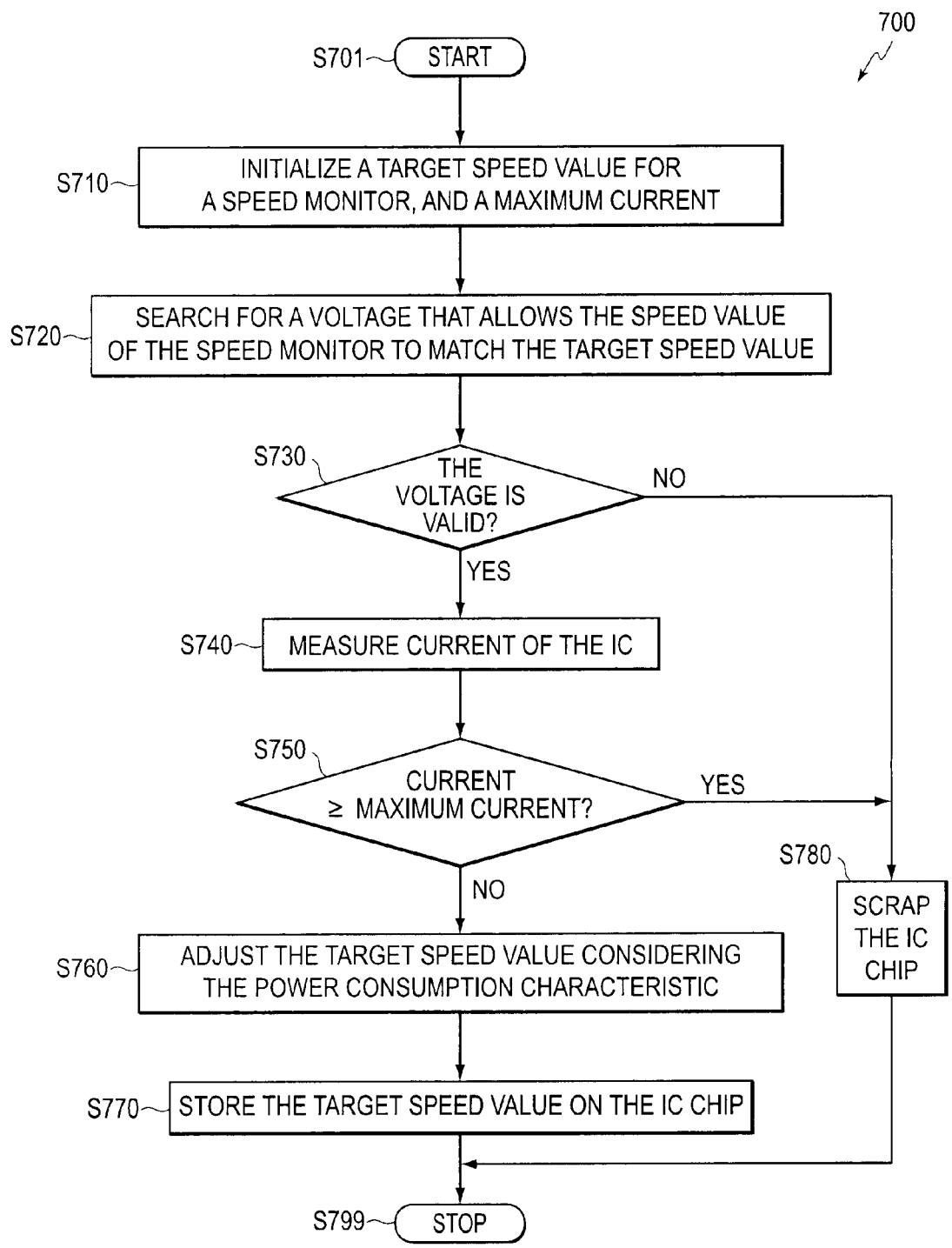
FIG. 7 shows a flow chart outlining a process example 700 for increasing yield according to an embodiment of the disclosure.

FIG. 7 shows a flow chart outlining a process example 700 for increasing yield according to an embodiment of the disclosure. The process 700 shows a detailed example of S530-S560 in FIG. 5. In the example, an IC chip includes a speed monitor that monitors a speed of circuits in the IC chip during operation. It is noted that the speed is affected by process variations and also affected by inputs, such as supply voltage, temperature, and the like. The process starts at S701 and proceeds to S710.

At S710, a target speed value for the on-chip speed monitor is initialized. In an example, a target speed value is determined according to the speed performance requirement and statistical data of previous measurement. In addition, a maximum current is determined according to the power consumption performance requirement. In an example, the maximum current is a sum of the maximum allowed leakage and dynamic current.

At S720, the tester searches for a voltage that allows the speed value of the speed monitor matches the target speed value. In an example, the tester steps up from a minimum voltage value of a general supply voltage range, such as 0.9V of a general supply voltage range of [0.9V, 1.1V], until the speed value of the speed monitor matches or exceeds the target speed value. In another example, the tester steps down from a maximum voltage value of a general supply voltage range, such as 1.1V of a general supply voltage range of [0.9V, 1.1V], until the speed value of the speed monitor matches the target speed value or the lower voltage limit is reached. It is noted that during this test, the voltage provided to the IC chip is not regulated based on the voltage control signal from the IC chip, but is controlled by the tester.

At S730, the tester determines whether the obtained voltage in S720 is valid. In an example, the tester determines whether the obtained voltage is in the range of the generally provided supply voltage. When the obtained voltage is in the range, the process proceeds to S740; otherwise, the process proceeds to S780.

At S740, the tester measures a current of the IC chip.

At S750, the tester determines whether the measured current is larger than the maximum current. When the measured current is larger than the maximum current, the process proceeds to S780; otherwise the process proceeds to S760.

At S760, the tester adjusts the target speed value considering the power consumption characteristic of the IC chip, such as the measured current of the IC chip. It is noted that, in an example, the tester adjusts the target speed value based on additional test results, such as test results of device structures in the scribe line or in a test die. In an example, the tester adjusts the target speed value to allow the IC chip to operate with suitable margins to the speed performance requirement and the power consumption performance requirement.

At S770, the target speed value is stored on the IC chip. In an example, the target speed value is stored in an OTP memory on the IC chip. The process then proceeds to S799 and terminates.

At S780, the IC chip is scrapped. The process then proceeds to S799 and terminates.

It is noted that the process 700 can be suitably modified. In an embodiment, S760 is skipped. In an example, at S710, the target speed value is initialized based on characteristics of the IC chip. For example, the target speed value is initialized based on a position of the IC chip on a wafer. In another example, the target speed value is initialized based on a parametric measurement of a test structure that is in a scribe line next to the IC chip. Then, S760 is skipped.

FIG. 8 shows a flow chart outlining a process example 800 for increasing yield according to an embodiment of the disclosure. The process 800 shows a detailed example of S530-S560 in FIG. 5. In the example, an IC chip includes a voltage monitor that monitors a voltage on the IC chip during operation. The process starts at S801 and proceeds to S810.

At S810, an upper voltage limit and a lower voltage limit for the voltage monitor is initialized. In an example, the upper voltage limit and the lower voltage limit are determined according to hard-coded voltage limits. For example, the upper voltage limit is initialized to be the maximum permissible voltage value of a generally provided supply voltage, and the lower voltage limit is initialized to be a minimum permissible voltage value of the generally provided supply voltage.

At S820, a tester reduces the upper voltage limit and applies a supply voltage according to the reduced upper voltage limit to the IC chip to test the power consumption performance of the IC chip. This step repeats until the power consumption performance satisfies the power consumption performance requirement for the IC chip.

At S830, the tester increases the lower voltage limit and applies a supply voltage according to the increased lower voltage limit to the IC chip to test the speed performance of the IC chip. This step repeats until the speed performance satisfies the speed performance requirement for the IC chip.

At S840, the tester determines whether the reduced upper voltage limit is still greater than the increased lower voltage limit. When the upper voltage limit is still greater than the lower voltage limit, the process proceeds to 850; otherwise, the process proceeds to S860.

At S850, the upper voltage limit and the lower voltage limit are stored on the IC chip. In an example, the upper voltage limit and the lower voltage limit are stored in OTP memory on the IC chip. The process then proceeds to S899 and terminates.

At S860, the IC chip is scrapped. The process then proceeds to S899 and terminates.

It is noted that the process 800 can be suitably modified. In an example, at S850, instead of storing the upper voltage limit and the lower voltage limit, an average of the upper voltage limit and the lower voltage limit is stored on the IC as a target voltage value.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. An integrated circuit (IC), comprising:
one or more first memory elements configured to store a specific value indicative of a lower voltage limit and of an upper voltage limit, for operation of the IC;
one or more second memory elements configured to store one or more specific values indicative of one or more target performance parameters of the IC; and
a controller configured to adjustably control an input voltage that is input to the IC to be within a range of voltages determined by the specific value for voltage limits stored in the one or more first memory elements, such that operation of the IC meets or exceeds target performances corresponding to the specific values indicative of the one or more target performance parameters stored in the one or more second memory elements.

2. The IC of claim 1, wherein a value stored in one of the one or more second memory elements corresponds to a speed above which the IC must operate.

3. The IC of claim 1, wherein a value stored in one of the one or more second memory elements corresponds to a power consumption below which the IC must operate.

4. The IC of claim 1, wherein the controller is configured to adjustably control the input voltage so that the IC meets or exceeds all the target performance parameters corresponding to the specific values stored in the one or more second memory elements.

5. The IC of claim 1, further comprising:
a regulator configured to supply to the IC a regulated input voltage responsively to a feedback signal, wherein the controller is configured to generate the feedback signal based on a measured performance of the IC, and to provide the feedback signal to the regulator.

6. The IC of claim 5, wherein the feedback signal of the controller is a signal indicative of an amount of adjustment in the regulated input voltage supplied to the IC by the regulator.

7. The IC of claim 5, wherein the performance corresponds to a speed of the IC.

8. The IC of claim 1, wherein the controller further comprises a monitor circuit configured to monitor a voltage on the IC during operation, and the controller is further configured to generate a feedback signal based on whether the monitored voltage is within the lower and upper voltage limits such that operation of the IC meets or exceeds the target performance parameters.

9. The IC of claim 1, wherein the one or more first memory elements are configured to store a target voltage determined based on an average of lower and upper voltage limits for operating the IC.

10. The IC of claim 9, wherein the controller further comprises a monitor circuit configured to monitor a voltage on the IC during operation, and the controller is further configured to generate a feedback signal based on whether the monitored voltage substantially corresponds to the target voltage such that operation of the IC meets or exceeds the target performance parameters.

11. A method for operating an integrated circuit (IC), comprising:
storing a specific value in one or more first memory elements, the specific value being indicative of a lower voltage limit and of an upper voltage limit, for operation of the IC;
storing one or more specific values in one or more second memory elements, the one or more specific values being indicative of one or more target performance parameters of the IC; and
adjustably controlling, by a controller, an input voltage that is input to the IC to be within a range of voltages determined by the specific value for voltage limits stored in the one or more first memory elements, such that operation of the IC meets or exceeds target performances corresponding to the specific values indicative of the one or more target performance parameters stored in the one or more second memory elements.

12. The method of claim 11, further comprising:
operating the IC with a speed corresponding to a value stored in one of the one or more second memory elements, the speed determined by a required clock frequency of the IC.

13. The method of claim 11, further comprising:
operating the IC with a power consumption below a value stored in one of the one or more second memory elements, the power consumption determined by one of a life of a battery used to operate the IC, an amount of heat generated by the IC, and a sum of the maximum allowed leakage and dynamic current.

14. The method of claim 11, further comprising:
outputting a feedback signal to a regulator so that an input voltage supplied to the IC by the regulator causes the IC to meet or exceed the target performance parameters corresponding to the one or more specific values stored in the one or more second memory elements;

monitoring a voltage on the IC during operation; and
determining whether the monitored voltage is within voltage limits determined by the specific value stored in the one or more first memory elements.

15. The method of claim 14, further comprising:
adjusting, based on the feedback signal, an amount of the input voltage supplied to the IC by the regulator.

16. The method of claim 14, wherein one of the target performance parameters corresponds to a speed of the IC.

17. The method of claim 11, further comprising:
adjusting the input voltage using a feedback signal until the IC meets or exceeds all the target performance parameters corresponding to the specific values stored in the one or more second memory elements while monitoring a voltage on the IC during operation and maintaining the monitored voltage within voltage limits determined by the specific value stored in the one or more first memory elements.

18. The method of claim 11, further comprising:
monitoring a voltage on the IC during operation; and
generating a feedback signal based on whether the monitored voltage is within the lower and upper voltage limits such that operation of the IC meets or exceeds the target performance parameters.

19. The method of claim 11, further comprising:
averaging lower and upper voltage limits for operating the IC as a target voltage; and
storing the target voltage in the one or more first memory elements.

20. The method of claim 19, further comprising:
monitoring a voltage on the IC during operation; and
generating a feedback signal based on whether the monitored voltage substantially corresponds to the target voltage such that operation of the IC meets or exceeds the target performance parameters.

* * * * *